(12) United States Patent
Choi et al.

(10) Patent No.: US 10,811,624 B2
(45) Date of Patent: Oct. 20, 2020

(54) ELECTROLUMINESCENT DISPLAY AND METHOD OF MANUFACTURING THE SAME

(71) Applicant: LG Display Co., Ltd., Seoul (KR)

(72) Inventors: Howon Choi, Paju-si (KR); Joonyoung Heo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/107,180

(22) Filed: Aug. 21, 2018

(65) Prior Publication Data

US 2019/0074466 A1 Mar. 7, 2019

(30) Foreign Application Priority Data

Sep. 4, 2017 (KR) ........................ 10-2017-0112536

(51) Int. Cl.
| | | |
|---|---|---|
| *H01L 51/50* | (2006.01) | |
| *H01L 51/00* | (2006.01) | |
| *H01L 27/32* | (2006.01) | |
| *G09G 3/3233* | (2016.01) | |
| *G09G 3/3266* | (2016.01) | |
| *G09G 3/3291* | (2016.01) | |
| *H01L 51/52* | (2006.01) | |
| *H01L 51/56* | (2006.01) | |

(52) U.S. Cl.
CPC ....... *H01L 51/5012* (2013.01); *G09G 3/3233* (2013.01); *G09G 3/3266* (2013.01); *G09G 3/3291* (2013.01); *H01L 27/3246* (2013.01); *H01L 27/3248* (2013.01); *H01L 27/3258* (2013.01); *H01L 51/0021* (2013.01); *H01L 51/5206* (2013.01); *H01L 51/56* (2013.01); *G09G 2300/043* (2013.01); *G09G 2310/08* (2013.01); *H01L 27/3211* (2013.01)

(58) Field of Classification Search
CPC ............ H01L 27/3211; H01L 27/3246; H01L 27/3258; H01L 51/5102; H01L 51/5206; H01L 51/56
See application file for complete search history.

(56) References Cited

U.S. PATENT DOCUMENTS

| | | | | |
|---|---|---|---|---|
| 2008/0231168 A1* | 9/2008 | Choi | ............... | H01L 27/3246 |
| | | | | 313/500 |
| 2009/0309493 A1* | 12/2009 | Seo | ............... | H01L 27/3246 |
| | | | | 313/506 |
| 2010/0133993 A1* | 6/2010 | Pang | ............... | H01L 27/3246 |
| | | | | 313/504 |

* cited by examiner

*Primary Examiner* — Dale E Page
*Assistant Examiner* — Quovaunda Jefferson
(74) *Attorney, Agent, or Firm* — Morgan, Lewis & Bockius LLP

(57) ABSTRACT

An electroluminescent display includes a lower substrate having a display area with subpixel emission areas defined in the display area; an electrode layer on the lower substrate; a planarization layer formed on the lower substrate such that holes are formed in the planarization layer with each hole being adjacent to a respective one of the subpixel emission areas; lower electrode layer in the respective subpixel emission area; a sacrificial layer surrounding the subpixel emission area and absent at an area having the lower electrode layer; an organic emission layer on the lower electrode layer; and an upper electrode layer on the organic emission layer.

6 Claims, 17 Drawing Sheets

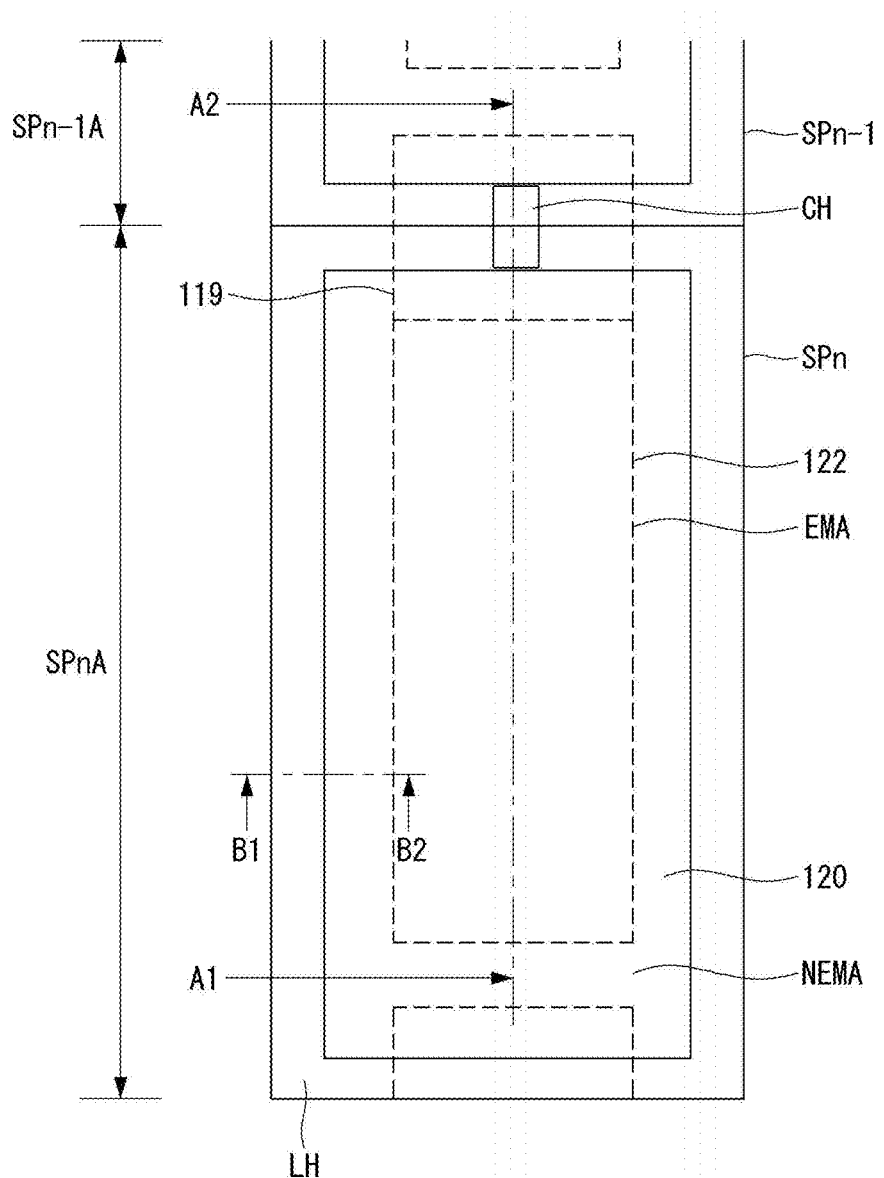

FIG. 11
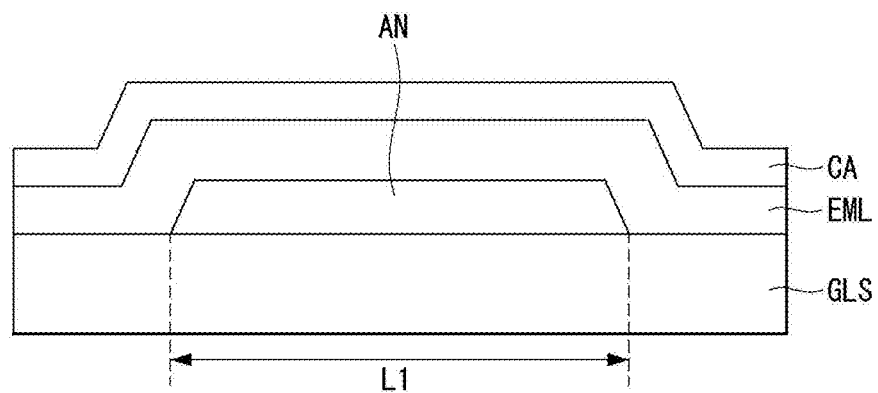
(a)
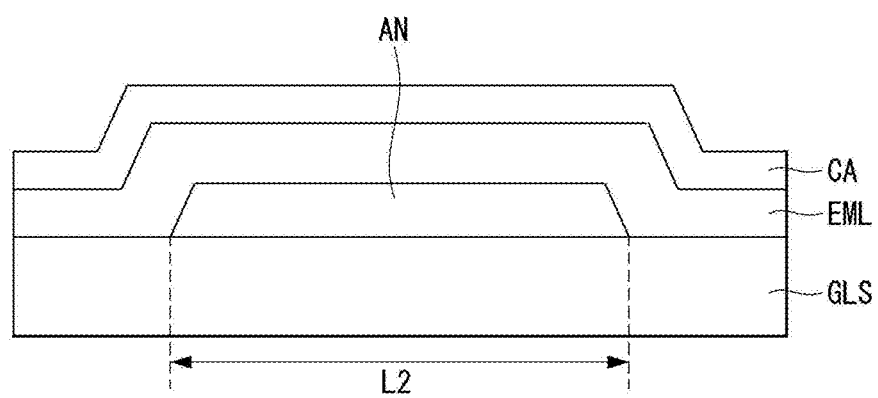
(b)
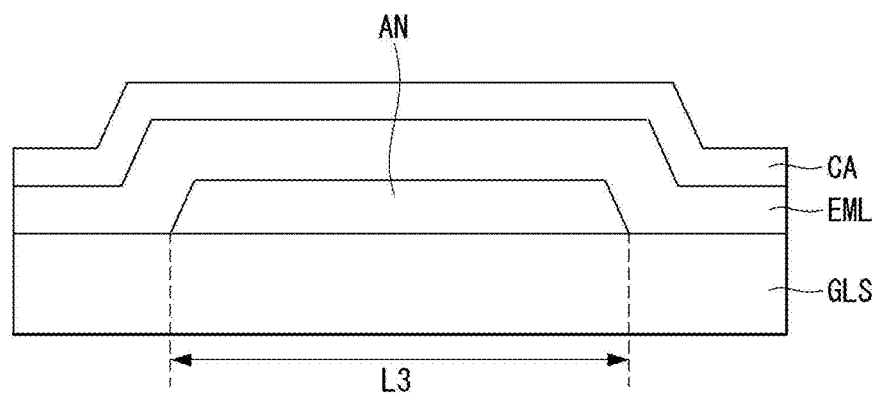
(c)

FIG. 16
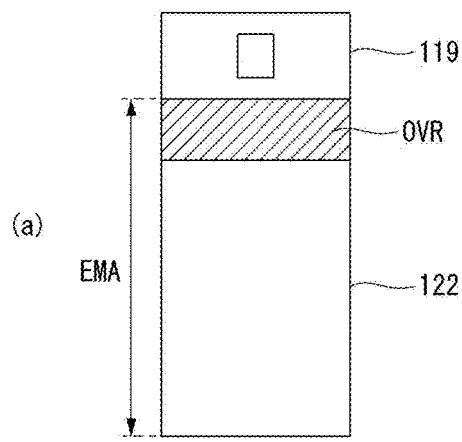
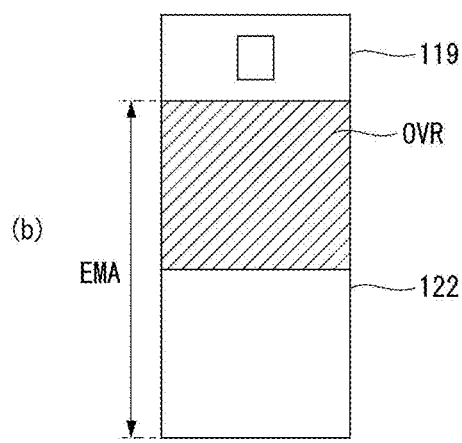
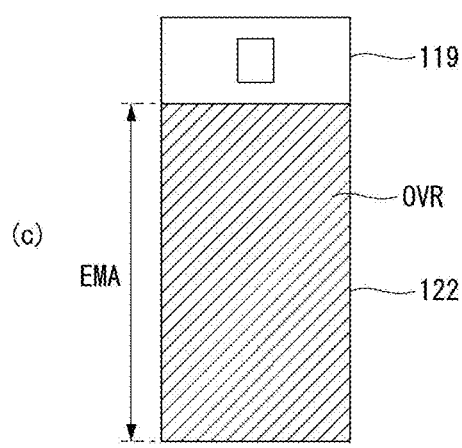

US 10,811,624 B2
ELECTROLUMINESCENT DISPLAY AND METHOD OF MANUFACTURING THE SAME

This application claims the benefit of Korean Patent Application No. 10-2017-0112536, filed on Sep. 4, 2017, which is incorporated herein by reference for all purposes as if fully set forth herein.

BACKGROUND

Technical Field

The present disclosure relates to an electroluminescent display and a method of manufacturing the same.

Description of the Related Art

With the development of information technology, the market for display devices used as an interface medium between a user and information has grown. Thus, the use of various types of display devices, such as an electroluminescent display, a liquid crystal display, and a plasma display panel, has been on the rise.

A display device includes a display panel including a plurality of subpixels, a driver for driving the display panel, a power supply unit for supplying electric power to the display panel, and the like. The driver includes a scan driver for supplying a scan signal (or referred to as a "gate signal") to the display panel, a data driver for supplying a data signal to the display panel, and the like.

An electroluminescent display can display an image through a light emitting operation of light emitting diodes of subpixels selected by supplying a scan signal, a data signal, etc. to the subpixels. The light emitting diode may be formed based on an organic material or an inorganic material.

Because an electroluminescent display displays an image based on light generated by the light emitting diode included in the subpixel, the electroluminescent display has various advantages, and therefore, is spotlighted as a next generation display device. However, the related art electroluminescent display has a problem that an aperture ratio has to be improved while reducing a current leakage of the light emitting diodes to achieve an ultra-high resolution.

SUMMARY

Accordingly, embodiments of the present disclosure are directed to an electroluminescent display and a method of manufacturing the same that substantially obviate one or more of the problems due to limitations and disadvantages of the related art.

An aspect of the present disclosure is to provide an electroluminescent display that has a high aperture ratio.

Another aspect of the present disclosure is to provide an electroluminescent display with light emitting diodes having low leakage current.

Another aspect of the present disclosure is to provide an electroluminescent display with light emitting diodes having excellent electrical characteristics.

Another aspect of the present disclosure is to provide an electroluminescent display with an ultra-high resolution.

Another aspect of the present disclosure is to provide an electroluminescent display that can be efficiently manufactured.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an electroluminescent display comprises a lower substrate having a display area with subpixel emission areas defined in the display area; an electrode layer on the lower substrate; a planarization layer formed on the lower substrate such that holes are formed in the planarization layer with each hole being adjacent to a respective one of the subpixel emission areas; lower electrode layer in the respective subpixel emission area; a sacrificial layer surrounding the subpixel emission area and absent at an area having the lower electrode layer; an organic emission layer on the lower electrode layer; and an upper electrode layer on the organic emission layer.

In another aspect, a method of manufacturing an electroluminescent display comprises forming a sacrificial layer on a lower substrate; forming a separation layer on the sacrificial layer on the sacrificial layer such that a portion of the sacrificial layer is exposed; etching the sacrificial layer such that a portion of the sacrificial layer exposed by the separation layer is removed and such that a portion of the sacrificial layer covered by the separation layer is undercut to define a tapered edge of the sacrificial layer; depositing a conductive material over the separation layer and in the portion exposed by the separation layer to form a lower electrode at the portion exposed by the separation layer.

In another aspect, an electroluminescent display comprises a lower substrate having a display area with subpixel emission areas defined in the display area; an electrode layer on the lower substrate; a planarization layer formed on the lower substrate, pattern holes being formed in the planarization layer such that each pattern hole surrounds a respective one of the subpixel emission areas; a connection electrode layer formed on the planarization layer in a respective subpixel emission area of the subpixel emission areas and in a respective pattern hole of the pattern holes to be electrically connected with the electrode layer at a contact portion of the respective pattern hole; a lower electrode layer on the connection electrode layer in the respective subpixel emission area; an organic emission layer on the lower electrode layer; and an upper electrode layer on the organic emission layer.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles.

FIG. 5 is a plan view of a subpixel of an OLED display according to an example embodiment of the disclosure.

FIG. 11 illustrates experimental samples for changes in an amount of current depending on a size of an anode electrode and a taper angle of an end of the anode electrode.

FIG. 16 illustrates an example of an overlap between a connection electrode layer and a lower electrode layer according to another example embodiment of the disclosure.

DETAILED DESCRIPTION

Reference will now be made in detail to embodiments of the present disclosure, examples of which are illustrated in the accompanying drawings. Wherever convenient for explanation of the embodiments provided herein, the same reference numbers will be used throughout the drawings to refer to the same or like parts. In the present disclosure, a detailed description of known components or functionalities may be omitted if it is determined that a detailed description of such known components or functionalities may mislead or otherwise obscure the description of the embodiments of the present disclosure.

An electroluminescent display according to embodiments of the disclosure may be implemented as televisions, video players, personal computers (PCs), home theaters, smart phones, virtual reality (VR) devices, and the like. In the following description, embodiments of the disclosure use an organic light emitting diode (OLED) display implemented based on an organic light emitting diode (or referred to as "light emitting element"), as an example of an electroluminescent display. However, embodiments are not limited thereto. For example, an inorganic light emitting diode may be used for an electroluminescent display.

Figure 1:
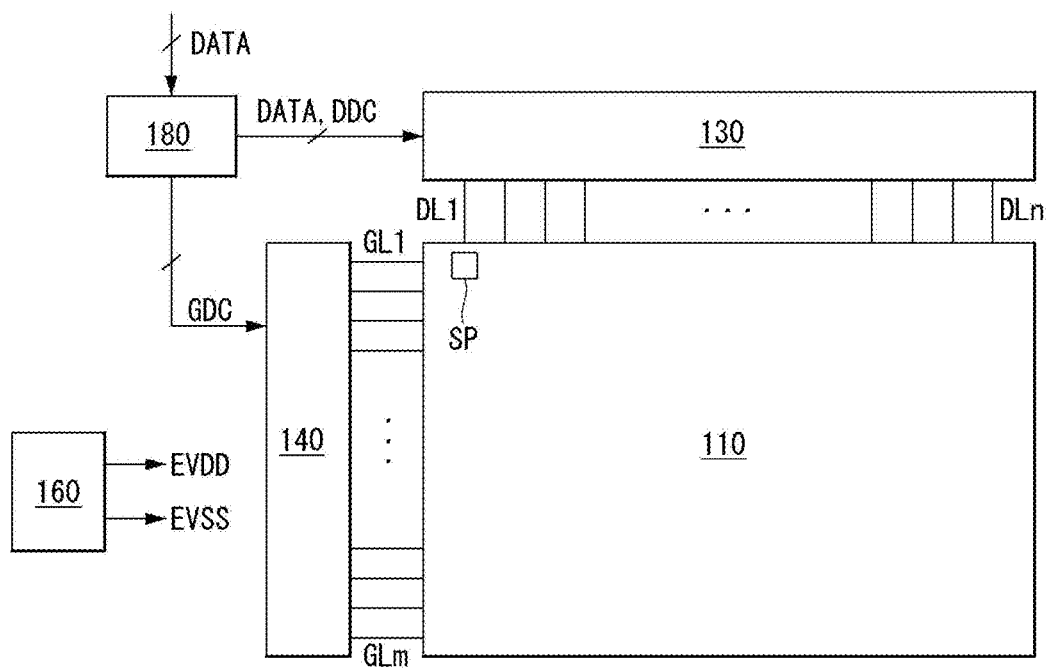
FIG. 1 is a schematic block diagram of an organic light emitting diode (OLED) display.
Figure 2:
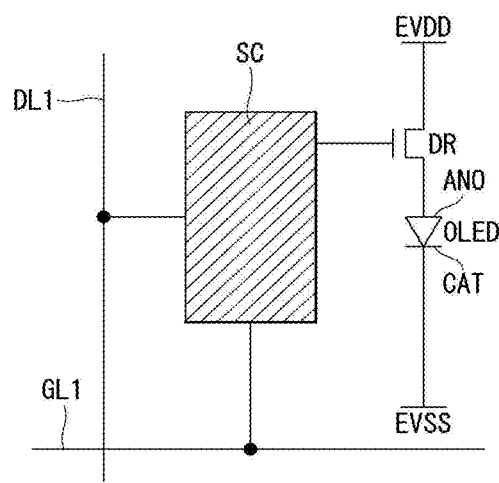
FIG. 2 is a schematic diagram illustrating a circuit configuration of a subpixel.
Figure 3A:
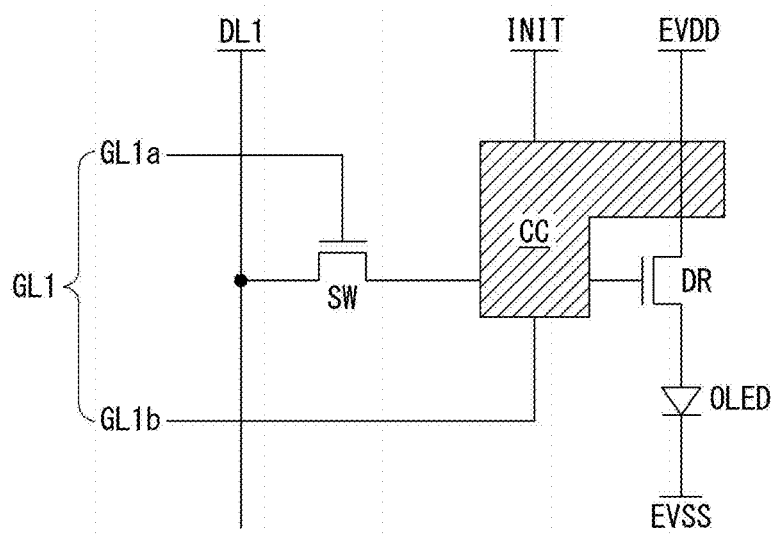
FIGS. 3A and 3B illustrate detailed circuit configurations of the subpixel of FIG. 2.
Figure 3B:
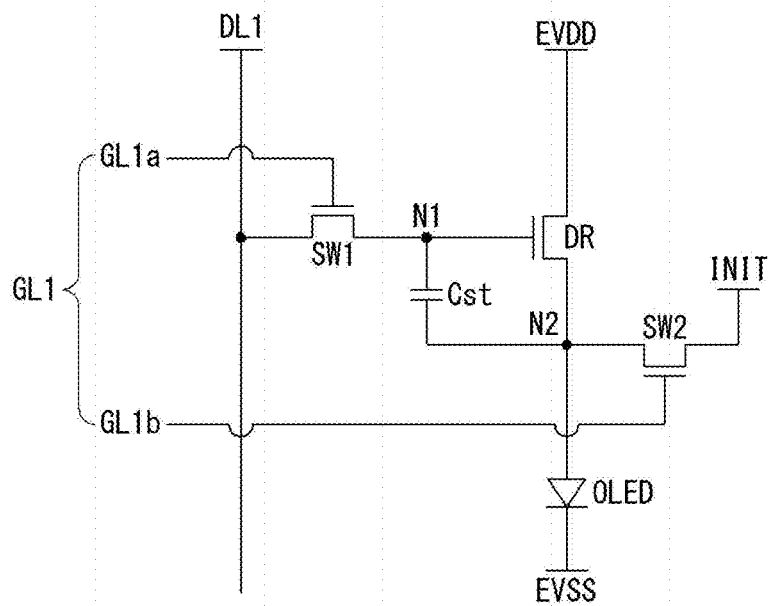
Figure 4A:
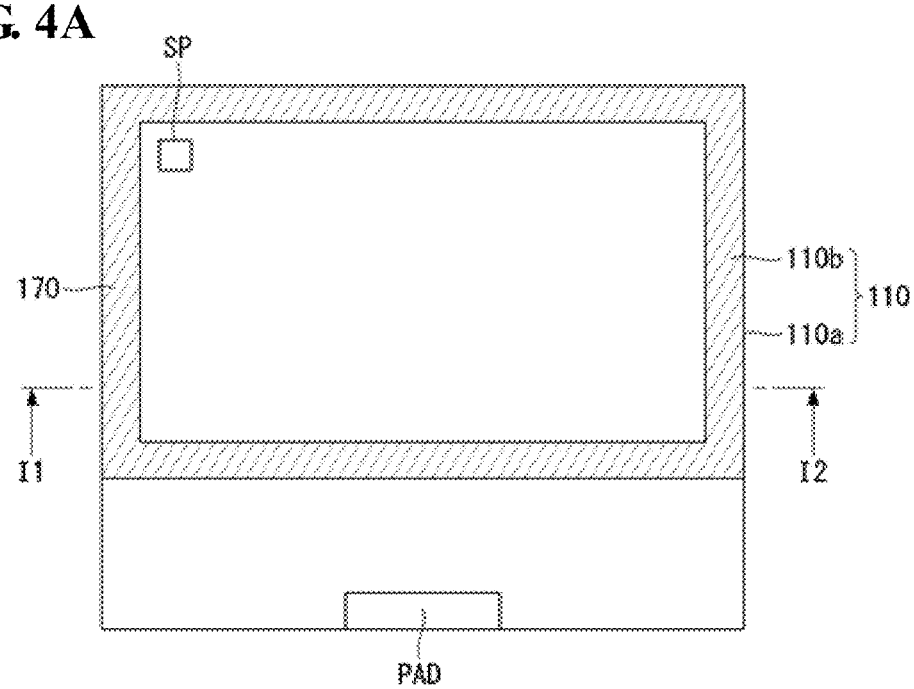
FIGS. 4A and 4C are a plan view and cross-sectional views illustrating arrangements of a display panel.
Figure 4B:
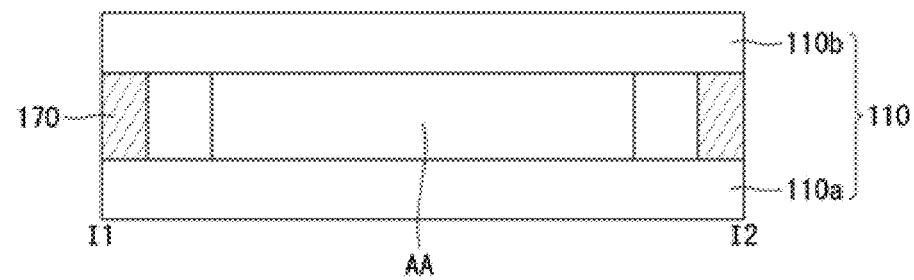
Figure 4C:
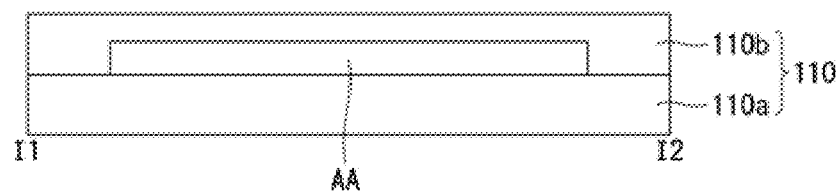

FIG. 1 is a schematic block diagram of an organic light emitting diode (OLED) display. FIG. 2 schematically illustrates a circuit configuration of a subpixel. FIGS. 3A and 3B illustrate detailed circuit configurations of the subpixel of FIG. 2. FIGS. 4A to 4C are a plan view and cross-sectional views illustrating arrangements of a display panel.

As shown in FIG. 1, an OLED display includes a timing controller 180, a data driver 130, a scan driver 140, a display panel 110, and a power supply unit 160. The timing controller 180 receives a data signal DATA, driving signals including a data enable signal, a vertical sync signal, a horizontal sync signal, and a clock signal, and the like from an image processing unit (not shown). The timing controller 180 outputs a gate timing control signal GDC for controlling operation timing of the scan driver 140 and a data timing control signal DDC for controlling operation timing of the data driver 130 based on the driving signals.

The data driver 130 samples and latches the data signal DATA received from the timing controller 180 in response to the data timing control signal DDC supplied from the timing controller 180 and converts a digital data signal into an analog data signal (or referred to as "data voltage") using gamma reference voltages. The data driver 130 then outputs the data signal DATA to data lines DL1 to DLn. The data driver 130 may be formed as an integrated circuit (IC) or other suitable arrangement.

The scan driver 140 outputs a scan signal in response to the gate timing control signal GDC supplied from the timing controller 180. The scan driver 140 outputs the scan signal to scan lines GL1 to GLm. The scan driver 140 may be formed as an IC or formed on the display panel 110 in a gate-in-panel (GIP) manner (for forming a transistor using a thin film process).

The power supply unit 160 outputs a high potential voltage and a low potential voltage. The high potential voltage and the low potential voltage are supplied to the display panel 110. For example, the high potential voltage may be supplied to the display panel 110 through a first power line EVDD, and the low potential voltage may be supplied to the display panel 110 through a second power line EVSS.

The display panel 110 displays an image based on the data signal DATA received from the data driver 130, the scan signal received from the scan driver 140, and electric power received from the power supply unit 160. The display panel 110 includes subpixels SP that operate to display an image and emit light.

The subpixels SP may include red, green, and blue subpixels, or may include white, red, green, and blue subpixels. The subpixels SP may have one or more different emission areas depending on emission characteristics.

As shown in FIG. 2, a subpixel is positioned at an intersection of a data line DL1 and a scan line GL1 and includes a programming unit SC for setting a gate-to-source voltage of a driving transistor DR and an organic light emitting diode OLED. Transistors constituting the subpixel may be implemented as p-type transistors or n-type transistors. Further, semiconductor layers of the transistors constituting the subpixel may include amorphous silicon, polycrystalline silicon, or oxide. The organic light emitting diode OLED includes an anode ANO, a cathode CAT, and an organic emission layer between the anode ANO and the cathode CAT. The anode ANO is connected to the driving transistor DR.

The programming unit SC may include at least one switching transistor and at least one capacitor. The switching transistor is turned on in response to the scan signal from the scan line GL1 and, thus, applies the data voltage from the data line DL1 to one electrode of a capacitor. The driving transistor DR controls an amount of current depending on a magnitude of a voltage charged to the capacitor and adjusts an amount of light emitted from the organic light emitting diode OLED. The amount of light emitted from the organic light emitting diode OLED is proportional to the amount of current supplied from the driving transistor DR. In addition, the subpixel is connected to the first power line EVDD and the second power line EVSS and is supplied with the high potential voltage and the low potential voltage through the first power line EVDD and the second power line EVSS.

As shown in FIG. 3A, a subpixel may include an internal compensation circuit CC in addition to a switching transistor SW, a driving transistor DR, a capacitor Cst, and an organic light emitting diode OLED that are described above. The internal compensation circuit CC may include one or more transistors connected to a compensation signal line INIT. The internal compensation circuit CC sets a gate-to-source voltage of the driving transistor DR to a voltage, to which a threshold voltage of the driving transistor DR is reflected, thereby excluding changes in a luminance resulting from the threshold voltage of the driving transistor DR when the organic light emitting diode OLED emits light. In this instance, the scan line GL1 includes at least two scan lines GL1a and GL1b for controlling the switching transistor SW and the transistors of the internal compensation circuit CC.

As shown in FIG. 3B, a subpixel may include a switching transistor SW1, a driving transistor DR, a sensing transistor SW2, a capacitor Cst, and an organic light emitting diode OLED. The sensing transistor SW2 is a transistor which may be included in the internal compensation circuit CC, and performs a sensing operation for a compensation drive of the subpixel.

The switching transistor SW1 may supply a data voltage supplied through the data line DL1 to a first node N1 in response to a scan signal supplied through the first scan line GL1a. The sensing transistor SW2 may initialize or sense a second node N2 between the driving transistor DR and the organic light emitting diode OLED in response to a sensing signal supplied through the second scan line GL1b.

The circuit configurations of the subpixel shown in FIGS. 3A and 3B are examples for facilitating understanding of embodiments of the disclosure. In other words, embodiments are not limited thereto and may use various configurations including 2T (Transistor) 1C (Capacitor), 3T1C, 4T2C, 5T2C, 6T2C, 7T2C, etc.

As shown in FIGS. 4A to 4C, the display panel 110 may include a lower substrate 110a, an upper substrate 110b, a display area AA, a pad portion PAD, a sealing member 170, and the like. At least one of the lower substrate 110a and the upper substrate 110b are selected from a light transmitting material, such as from transparent resin or glass that can transmit light. For example, the lower substrate 110a may be a silicon substrate. The display area AA includes subpixels that emit light. The pad portion PAD includes pads for the electrical connection with an external substrate.

The display area AA may be disposed to occupy almost the entire surface of the lower substrate 110a, and the pad portion PAD may be disposed at an edge of one side of the lower substrate 110a. In FIG. 4B, the display area AA may be sealed by the sealing member 170 between the lower substrate 110a and the upper substrate 110b and is protected from moisture or oxygen. Alternatively, as shown in FIG. 4C, the display area AA may be sealed using the first substrate 110a and the second substrate 110b alone. On the other hand, the pad portion PAD may be exposed to the outside. However, a sealing structure of the display panel 110 may be variously implemented, and thus embodiments are not limited thereto.

The OLED display is classified into a bottom emission type, in which light is emitted in a direction of the lower substrate 110a, and a top emission type in which light is emitted in a direction of the upper substrate 110b. However, a related art OLED display has a problem that an aperture ratio has to be improved while reducing a current leakage of an organic light emitting diode in order to achieve an ultra-high resolution. Hence, embodiments of the disclosure propose the following structure.

Figure 6:
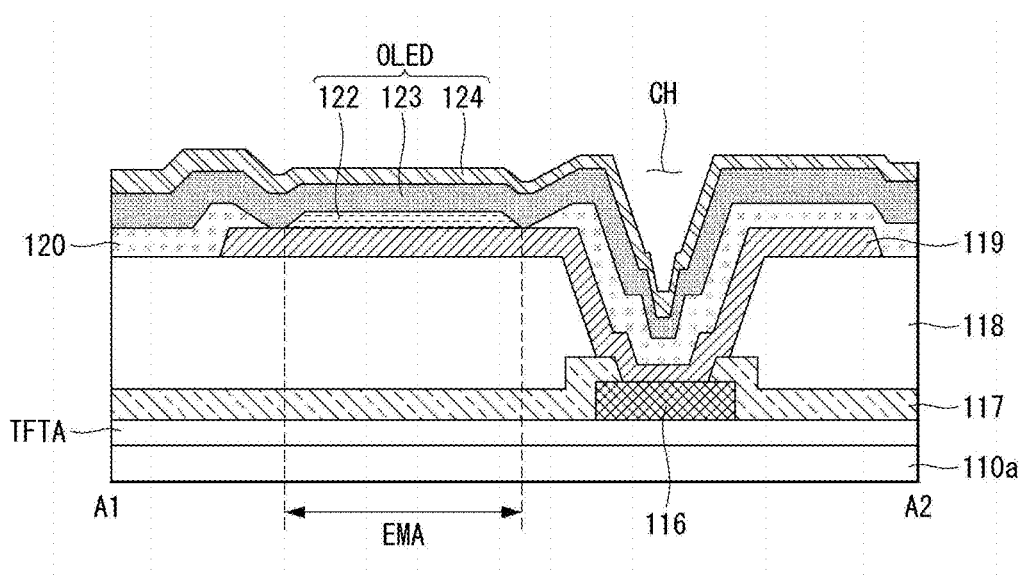
FIG. 6 is a cross-sectional view taken along line A1-A2 of FIG. 5.
Figure 7:
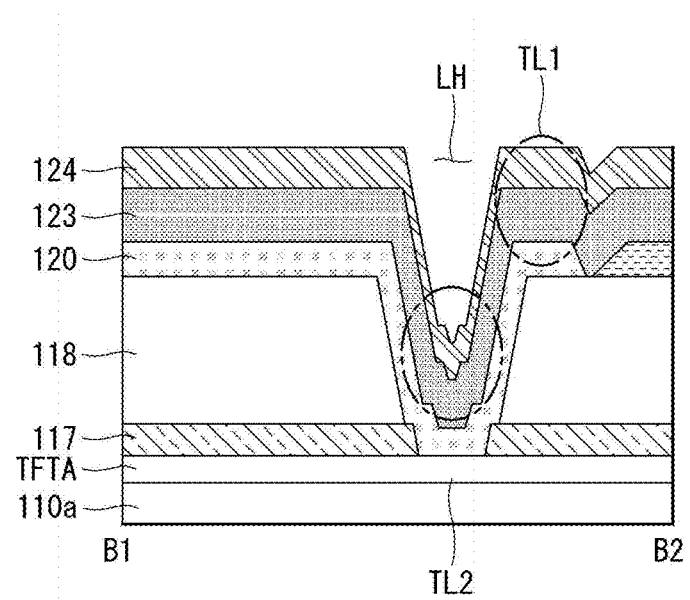
FIG. 7 is a cross-sectional view taken along line B1-B2 of FIG. 5.
Figure 8:
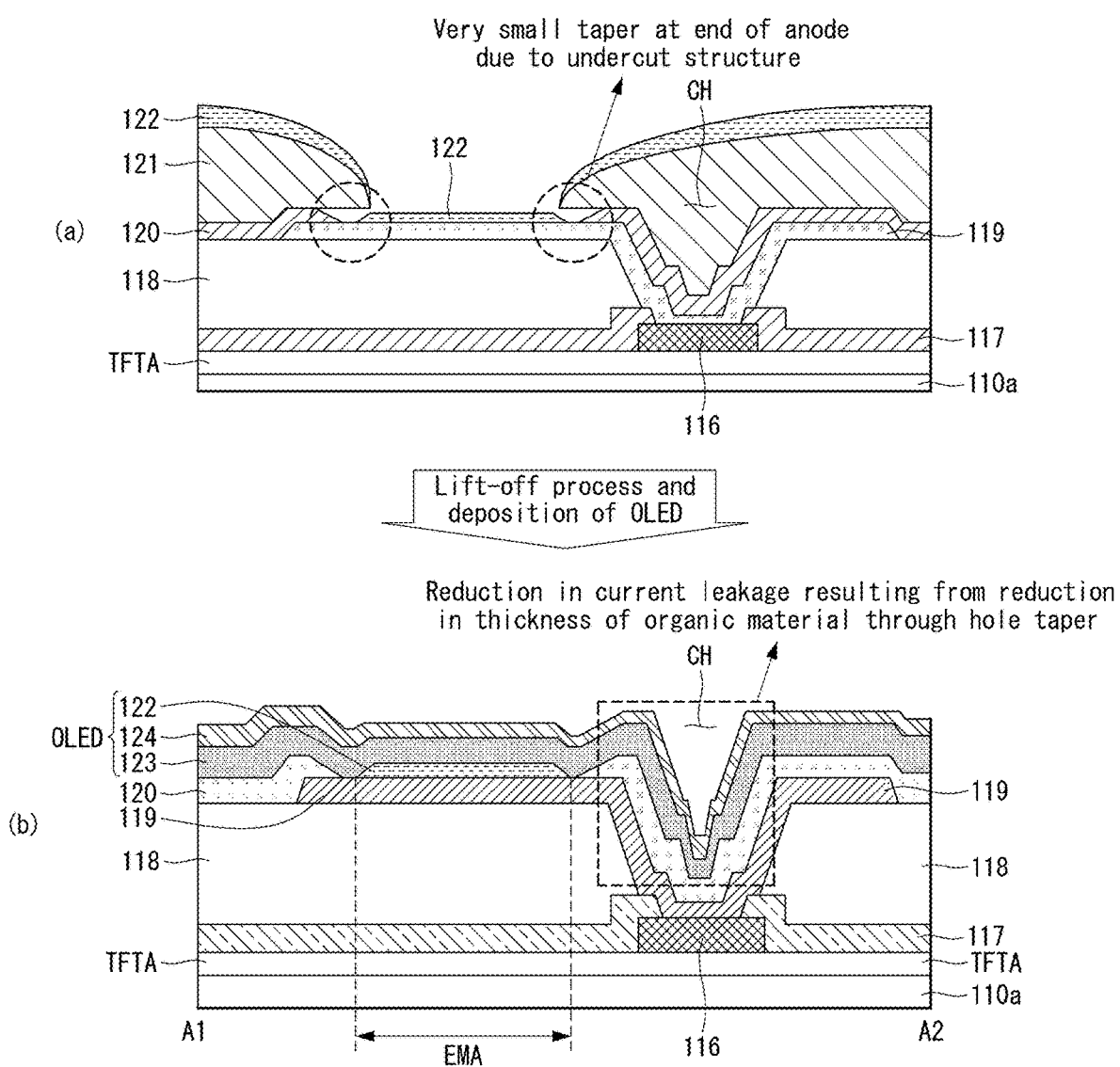
FIG. 8 is a cross-sectional view illustrating a process for forming an organic emission layer and an upper electrode layer in accordance with an example embodiment of the disclosure.

FIG. 5 is a plan view of a subpixel of an OLED display according to an example embodiment of the disclosure. FIG. 6 is a cross-sectional view taken along line A1-A2 of FIG. 5. FIG. 7 is a cross-sectional view taken along line B1-B2 of FIG. 5. FIG. 8 is a cross-sectional view illustrating a process for forming an organic emission layer and an upper electrode layer in accordance with an example embodiment of the disclosure.

As shown in FIGS. 5 and 6, an Nth subpixel SPn is formed in a bankless structure, in which a bank layer is not formed, to improve an aperture ratio. The aperture ratio corresponds to a size (or an area) of an emission region EMA, from which light can be substantially emitted, in an area SPnA of the Nth subpixel SPn. The emission region EMA of the Nth subpixel SPn is defined by not the bank layer but a sacrificial layer 120. A remaining portion excluding the emission region EMA from the area SPnA of the Nth subpixel SPn is defined as a non-emission region NEMA.

The Nth subpixel SPn forms a contact hole CH in a boundary portion between subpixels, in order to improve an aperture ratio. For example, the boundary portion between the subpixels is provided between an area SPn-1A of a (N−1)th subpixel SPn-1 and the area SPnA of the Nth subpixel SPn. A portion between the area SPn-1A of the (N−1)th subpixel SPn-1 and the area SPnA of the Nth subpixel SPn corresponding to the boundary portion is the non-emission region NEMA. Scan lines are generally disposed in the non-emission region NEMA.

The contact hole CH is used as a path for electrical contact (or electrical connection) between a transistor unit TFTA and an organic light emitting diode OLED. The contact hole CH may be disposed in an outer area of the Nth subpixel SPn. In order to improve the aperture ratio, the contact hole CH may be disposed in the boundary portion between the subpixels. Namely, the contact hole CH may be disposed over both the subpixels SPn-1 and SPn forming the boundary portion. FIG. 5 illustrates that the contact hole CH has a rectangular shape in which long sides are disposed in a longitudinal direction, by way of example. However, embodiments are not limited thereto. The outer area of the Nth subpixel SPn is the non-emission region NEMA, and a lower electrode layer 122 of the organic light emitting diode OLED is not formed in the outer area of the Nth subpixel SPn.

An electrode layer 116 of a driving transistor included in the transistor unit TFTA and the lower electrode layer 122 of the organic light emitting diode OLED are electrically connected by a connection electrode layer 119 disposed between them. The driving transistor included in the transistor unit TFTA may have various structures. Therefore, example embodiments of the disclosure briefly show only the electrode layer 116 of the driving transistor and will be described in detail focusing on a cross-sectional structure of the Nth subpixel SPn.

The transistor unit TFTA including the driving transistor, etc. is positioned on a lower substrate 110a. A lower insulating layer 117 partially exposing the electrode layer 116 of the driving transistor is positioned on the transistor unit TFTA. The electrode layer 116 of the driving transistor is a source electrode or a drain electrode. The lower insulating layer 117 serves as a protective layer for protecting the transistor unit TFTA.

A planarization layer 118 partially exposing the electrode layer 116 of the driving transistor is positioned on the lower insulating layer 117. The contact hole CH may be formed by an etching process after forming the lower insulating layer 117 and the planarization layer 118, so that the electrode layer 116 of the driving transistor is exposed. However, embodiments are not limited thereto.

The connection electrode layer 119 is disposed on the planarization layer 118. The connection electrode layer 119 is positioned on an upper surface of the planarization layer 118 and is connected to the electrode layer 116 of the driving transistor positioned inside the contact hole CH. The connection electrode layer 119 is positioned corresponding to the contact hole CH and the emission region EMA. The connection electrode layer 119 may include a portion positioned in the area SPnA of the Nth subpixel SPn and a portion positioned in the area SPn-1A of the (N−1)th subpixel SPn-1. A portion of the connection electrode layer 119 positioned in the area SPn-1A of the (N−1)th subpixel SPn-1 is a further protruding portion to reduce a process variation and a contact resistance. Alternatively, the connection electrode layer 119 may be formed to cover a portion of the emission region EMA of the Nth subpixel SPn and a portion of the contact hole CH.

The sacrificial layer 120 exposing a portion of the connection electrode layer 119 is disposed on the planarization layer 118. The sacrificial layer 120 exposes only a portion of the connection electrode layer 119 positioned on the upper surface of the planarization layer 118 and entirely covers a remaining portion including the contact hole CH. The lower electrode layer 122 is positioned on the connection electrode layer 119 exposed through the sacrificial layer 120. The lower electrode layer 122 is formed only on the connection electrode layer 119. The emission region EMA of the Nth subpixel SPn is defined as a portion of the connection electrode layer 119 exposed through the sacrificial layer 120 or the lower electrode layer 122 positioned on the connection electrode layer 119. The sacrificial layer 120 may further include a light absorbing material, such as a black based material, capable of preventing the reflection.

An organic emission layer 123 is disposed on the sacrificial layer 120 and the lower electrode layer 122. The organic emission layer 123 is formed to entirely cover a display area of the lower substrate 110*a*. The organic emission layer 123 may include an emission layer and a functional layer (for example, including a hole injection layer, a hole transport layer, an electron transport layer, an electron injection layer, etc.), or may include an emission layer, a functional layer, and a charge generation layer. The upper electrode layer 124 is positioned on the organic emission layer 123. The upper electrode layer 124 is formed to entirely cover the organic emission layer 123.

The lower electrode layer 122 is dividedly formed in areas of the subpixels. However, when the organic emission layer 123 is not dividedly formed in the subpixels and entirely covers the display area, the organic emission layer 123 is used as a path causing a current leakage of the organic light emitting diode OLED. As shown in FIG. 6, an upper surface of the lower electrode layer 122 may be higher or a same height as an upper surface of substantially flat portion of the sacrificial layer 120, for example, at a portion of the sacrificial layer 120 directly contacting the planarization layer 118.

The Nth subpixel SPn forms a pattern hole LH, that is depressed downward inside the Nth subpixel SPn, to improve the aperture ratio and reduce the current leakage of the organic light emitting diode OLED. The pattern hole LH is formed in a closed curved shape (or a rectangular shape) so as to surround the entire outer area of the Nth subpixel SPn. The pattern hole LH is formed together with the contact hole CH. Thus, the pattern hole LH is formed to surround the boundary portion between the subpixels. From FIGS. 5 to 7, because the pattern hole LH surround the subpixel, it should be recognized that the contact hole CH can be a portion of the pattern hole LH where the pattern hole LH crosses the electrode layer 116. Alternatively, the pattern hole LH and the contact hole CH can be separate.

As shown in FIG. 7, the pattern hole LH is formed to have a depth penetrating both the lower insulating layer 117 positioned on the lower substrate 110*a* and the planarization layer 118 positioned on the lower insulating layer 117. Namely, the pattern hole LH is formed to expose a portion of the lower substrate 110*a*. However, embodiments are not limited thereto. For example, the pattern hole LH may be formed to expose a portion of the lower insulating layer 117 without penetrating the lower insulating layer 117.

The sacrificial layer 120, the organic emission layer 123, and the upper electrode layer 124 are formed inside the pattern hole LH. The pattern hole LH has a small inner part that is deeply inclined. Therefore, layers TL2 formed inside the pattern hole LH have a thickness less than layers TL1 formed outside the pattern hole LH. In addition, even if the sacrificial layer 120, the organic emission layer 123, and the upper electrode layer 124 have the same thickness, a total thickness of the layers inside the pattern hole LH is different from a total thickness of the layers outside the pattern hole LH because of structural characteristics of the pattern hole LH.

Because the organic emission layer 123 or the organic emission layer 123 and the upper electrode layer 124 have an area having a small thickness due to the pattern hole LH, they can narrow a path causing the current leakage between the subpixels. Therefore, when the pattern hole LH is formed in the structure shown in FIG. 6, the current leakage of the organic light emitting diode OLED can be further reduced as compared to a related art device.

As shown in portion (a) of FIG. 8, in an example embodiment of the disclosure, when a separation layer 121 is formed on the sacrificial layer 120 and is patterned to expose the connection electrode layer 119, an undercut portion is formed under the separation layer 121. The separation layer 121 protrudes toward the inside of the emission region EMA more than the sacrificial layer 120 due to an undercut structure. An end of the sacrificial layer 120 that is removed when the undercut portion is formed has a gentle taper angle.

As shown in portion (b) of FIG. 8, after the lower electrode layer 122 is formed, the separation layer 121 is completely removed through a lift-off process. Then, the organic emission layer 123 and the upper electrode layer 124 are formed so that a deposition process of the organic light emitting diode OLED is completed.

As shown in portion (b) of FIG. 8, when the lower electrode layer 122 is formed based on the separation layer 121 having the undercut portion, the lower electrode layer 122 is self-aligned in each subpixel and is formed only on the connection electrode layer 119. An end (or edge) of the lower electrode layer 122 adjacent to the sacrificial layer 120 has a gentle taper angle due to the separation layer 121. The lower electrode layer 122 is spaced from the sacrificial layer 120 defining the emission region EMA because of the structure of the separation layer 121. Namely, the end of the sacrificial layer 120 and the end of the lower electrode layer 122 each have a gentle positive taper shape.

Further, a thickness of the organic emission layer (or an organic material) positioned inside the contact hole CH decreases due to an inclined structure of the contact hole CH, and thus, the current leakage of the organic light emitting diode OLED is reduced. The taper angle of the end of the lower electrode layer 122 is related to electrical characteristics of the organic light emitting diode OLED. This is described in detail below.

A reason why embodiments of the disclosure are configured as described above will be described in detail below.

Figure 9:
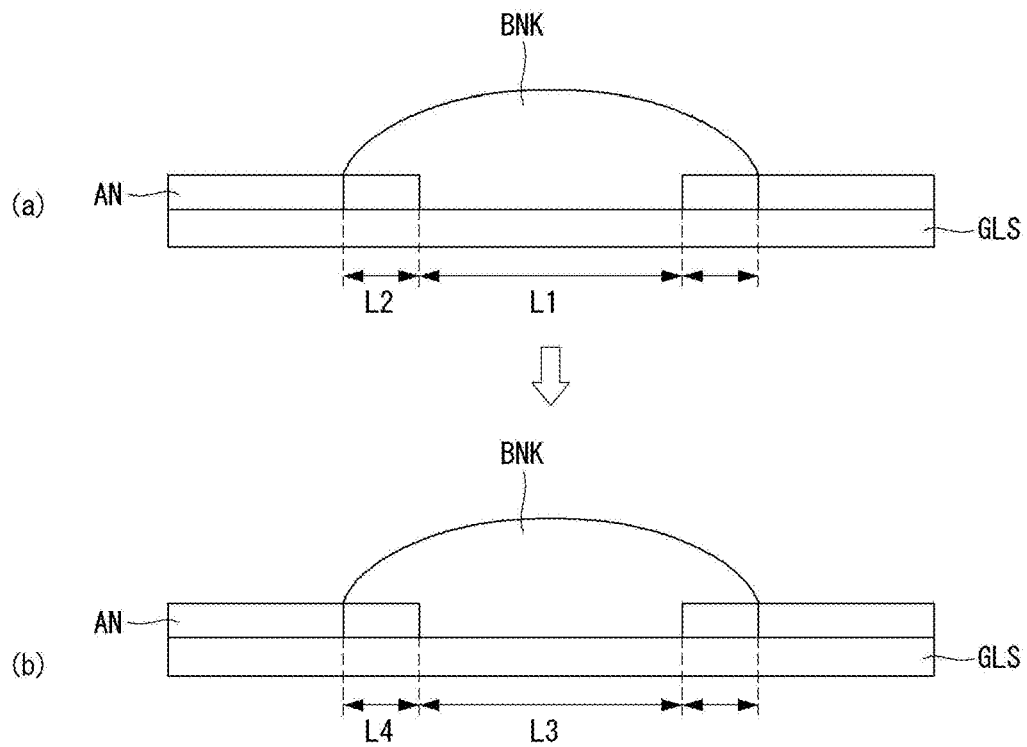
FIG. 9 illustrates experimental results on a design value and a process value of a bank layer.
Figure 10:
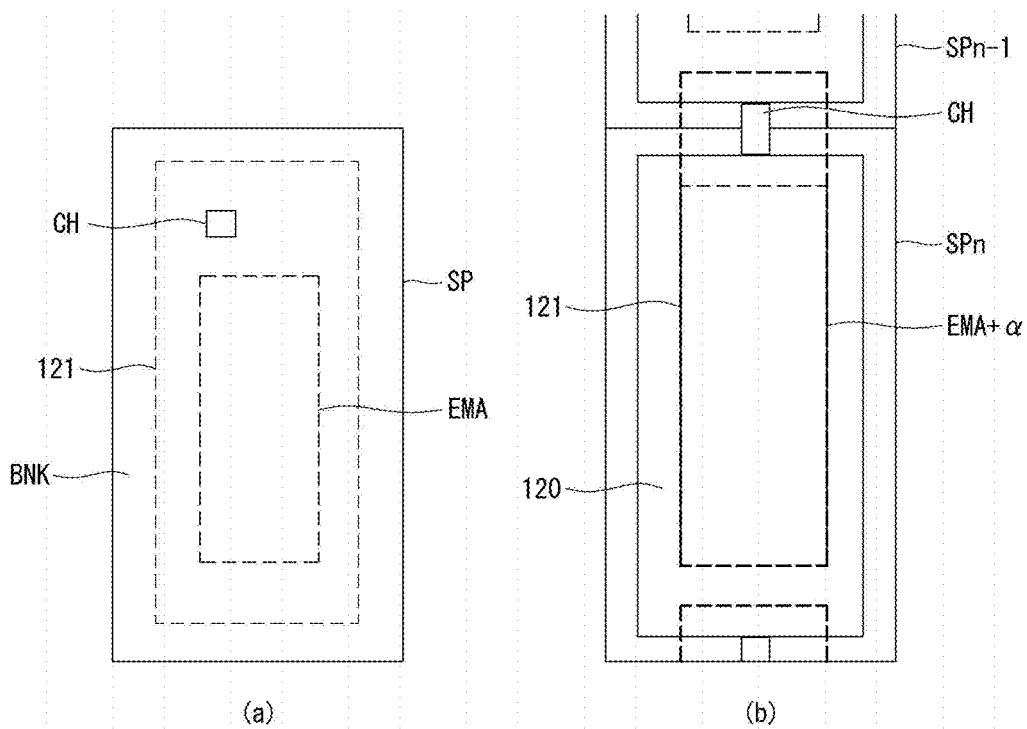
FIG. 10 illustrates a comparison between an aperture ratio according to an example embodiment of the disclosure and an aperture ratio according to a related art.
Figure 12:
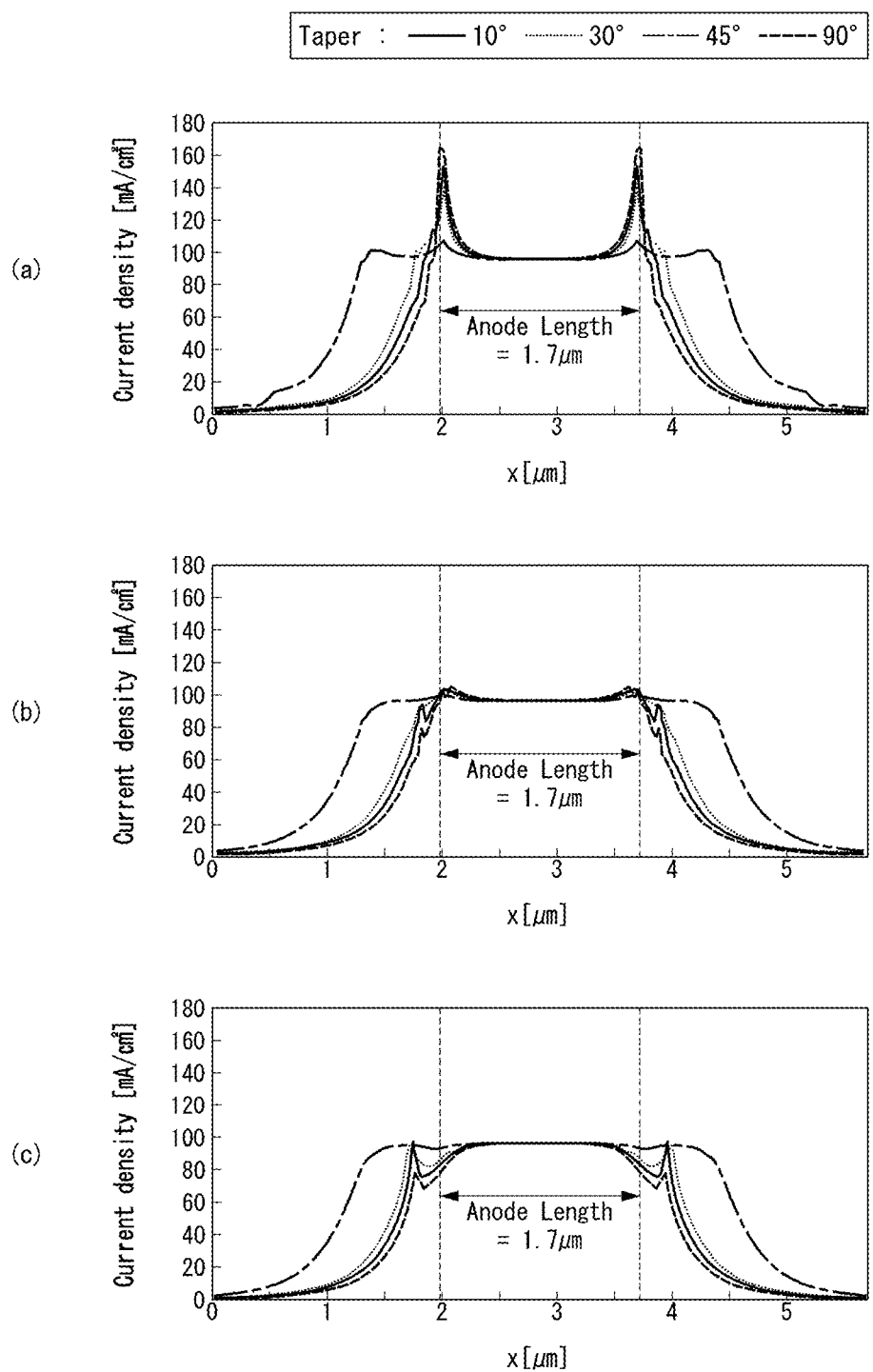
FIGS. 12 to 14 are graphs of simulation results illustrating changes in an amount of current for each experimental sample of FIG. 11.
Figure 13:
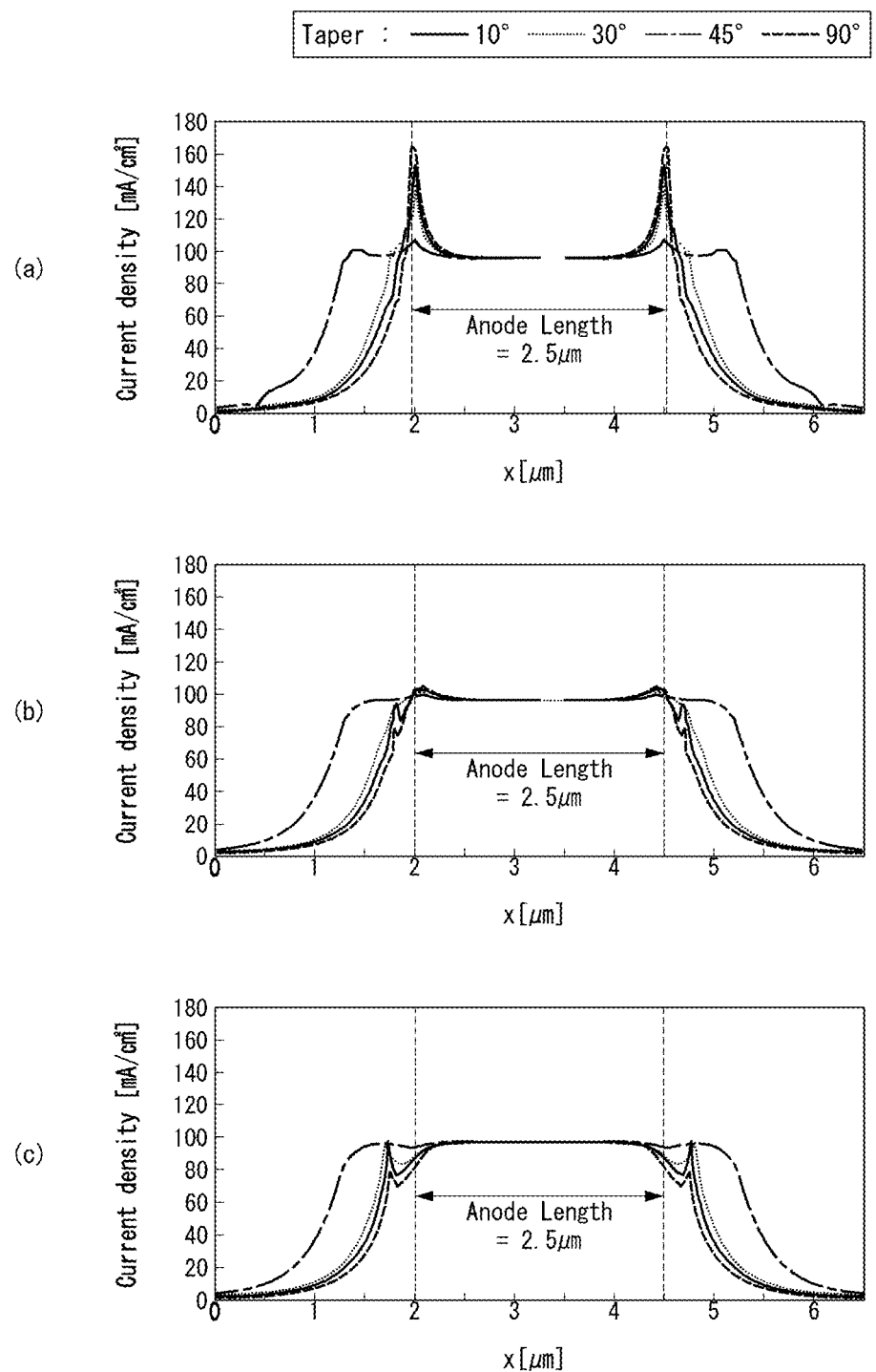
Figure 14:
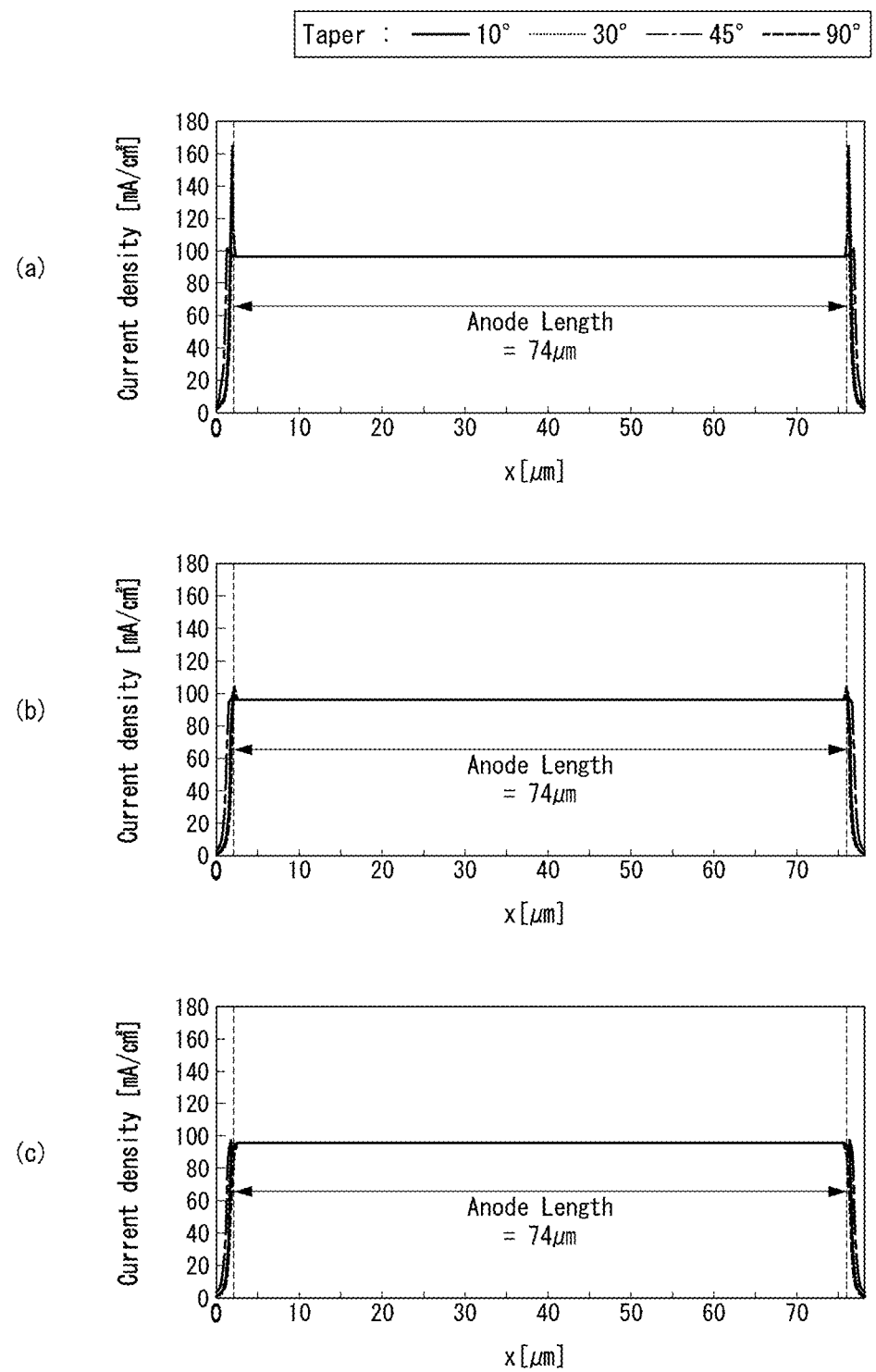

FIG. 9 illustrates experimental results on a design value and a process value of a bank layer. FIG. 10 illustrates a comparison between an aperture ratio according to an example embodiment of the disclosure and an aperture ratio according to a related art. FIG. 11 illustrates experimental samples for changes in an amount of current depending on a size of an anode electrode and a taper angle of an end of the anode electrode. FIGS. 12 to 14 are graphs of simulation results illustrating changes in an amount of current for each experimental sample of FIG. 11.

In FIG. 9, portion (a) illustrates a design value, and portion (b) illustrates a process value. As shown in FIG. 9, anode electrodes AN were formed on an organic substrate GLS to be spaced from each other, and a bank layer BNK was formed between the anode electrodes AN. It may be desired that the design value and the process value have the following relationship: L1=L3 and L2=L4. However, they have to at least satisfy a relationship where L1 is approximately equal to L3, and L2 is approximately equal to L4.

When a manufacturing process was actually performed, there was a difference between the design value and the process value. For example, there was a difference such that L1<L3 and L2<L4. Because of the difference, it was difficult to improve an aperture ratio of subpixels using a process based on the bank layer.

On the other hand, because a process (e.g., a self-alignment method) based on a sacrificial layer and a separation layer is configured such that a lower electrode layer is dividedly formed (i.e., pixelated) in the subpixels, the self-alignment method has a lower process variation generation rate and better pixelation than the process based on the bank layer. Namely, the process based on the sacrificial layer and the separation layer is easier to improve the aperture ratio than the process based on the bank layer when a high resolution is implemented.

In FIG. 10, portion (a) illustrates a structure of a subpixel according to a related art, and portion (b) illustrates a structure of a subpixel according to an example embodiment of the disclosure. As shown in FIG. 10, the embodiment of the disclosure adopts a structure (see portion (b) in FIG. 10) based on a sacrificial layer 121 and a separation layer and also changes a position of a contact hole CH to a boundary portion between the subpixels. As a result, an example embodiment of the disclosure can further improve a size of an emission region EMA as compared to a structure (see portion (a) of FIG. 10) using a bank layer BNK according to the related art.

As described above, an example embodiment of the disclosure can easily achieve the pixelation and can increase the emission region to an existing area occupied by the contact hole. Therefore, the example embodiment of the disclosure can further improve the size of the emission region as compared to the related art.

Further, embodiments of the disclosure can control the size of the lower electrode layer and the taper angle of the end of the lower electrode layer based on the undercut structure provided by the sacrificial layer and the separation layer. Experimental samples related to this are introduced below. However, the following experiment was conducted based on a passive organic light emitting diode (having a structure in which a driving transistor, etc. are omitted) including only an anode electrode, an organic emission layer, and a cathode electrode.

Experimental samples (a) to (c) shown in FIG. 11 were made based on a passive organic light emitting diode including an anode electrode AN, an organic emission layer EML, and a cathode electrode CA positioned on a glass substrate GLS. For example, FIG. 11 schematically illustrates structures of the experimental samples (a) to (c) used to know changes in an amount of current depending on a size of the anode electrode AN and a taper angle of an end of the anode electrode AN.

The experimental samples (a) to (c) had the following relationship in a width of the anode electrode AN: L1>L2>L3. FIG. 11 illustrates three experimental samples, by way of example. However, each experimental sample further includes four samples each having a different taper angle at the end of the anode electrode AN. In this instance, the taper angle of the end of the anode electrode AN in the four samples was 10°, 30°, 45°, and 90°. Simulation results of changes in an amount of current for each experimental sample is shown in FIGS. 12 to 14.

According to the simulation results of the experimental samples, when the taper angle of the end of the anode electrode AN was 10° to 45°, the organic light emitting diode obtained good electrical characteristics. Therefore, the end of the anode electrode AN may be provided to have a positive taper shape such that the taper angle of the end of the anode electrode AN does not exceed 45°.

The example embodiments of the disclosure can control the size of the lower electrode layer and the taper angle of the end of the lower electrode layer. According to the example embodiments of the disclosure and the experimental example, when the size of the lower electrode layer and the taper angle of the end of the lower electrode layer are provided accordingly, the electrical characteristics of the organic light emitting diode can be improved.

Figure 15:
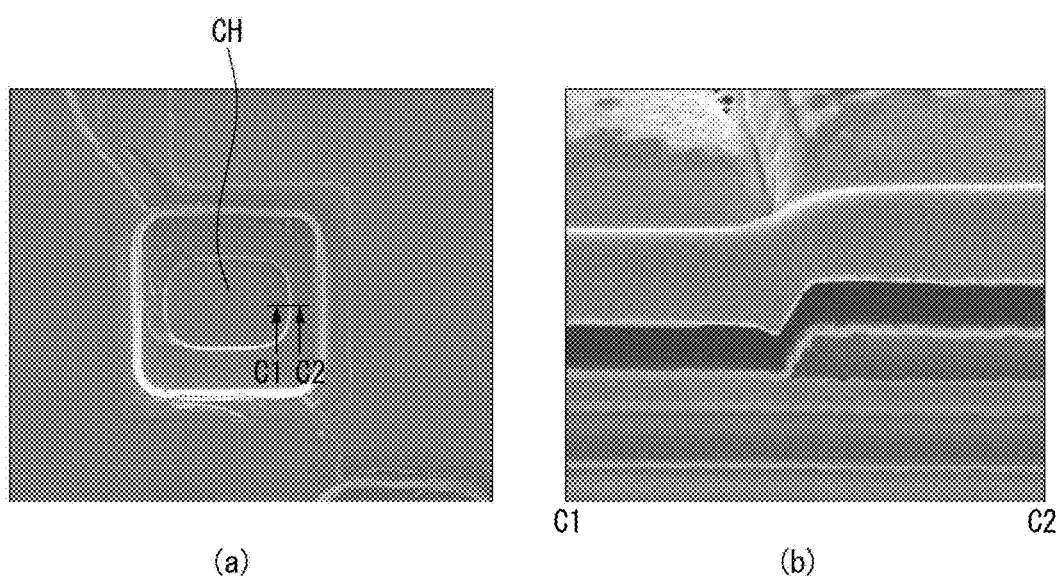
FIG. 15 illustrates a plan view and a cross-sectional photograph of a contact hole according to an example embodiment of the disclosure.

FIG. 15 illustrates a plan view and a cross-sectional photograph of a contact hole according to an example embodiment of the disclosure. FIG. 16 illustrates an example of an overlap between a connection electrode layer and a lower electrode layer according to another embodiment of the disclosure.

The embodiment of the disclosure can reduce a thickness of the organic emission layer positioned inside the contact hole because of the structural characteristics and, thus, can reduce current leakage. A structure to illustrate this will be shown through a photograph of FIG. 15 showing a contact hole CH and the periphery of the contact hole CH. Further, the embodiment of the disclosure can adjust an overlap area required when the connection electrode layer and the lower electrode layer contact each other. This will be shown with reference to FIG. 16.

Portion (a) of FIG. 16 illustrates a contact structure of a partial overlap OVR between a connection electrode layer 119 and a lower electrode layer 122. Portion (b) of FIG. 16 illustrates a contact structure of a half overlap OVR between the connection electrode layer 119 and the lower electrode layer 122. Portion (c) of FIG. 16 illustrates a contact structure of an entire overlap OVR between the connection electrode layer 119 and the lower electrode layer 122.

The overlap between the connection electrode layer 119 and the lower electrode layer 122 may vary depending on electrical and optical characteristics of a material of an electrode layer used in the design. The structure shown in portion (c) of FIG. 16 can further reduce a contact resistance as compared to other structures and is also advantageous in improving a planarization degree.

A method of manufacturing according to embodiments of the disclosure is described below. Because a pattern hole can be formed through the same process as a contact hole, the process for forming the pattern hole will be omitted and is described with reference to FIG. 7.

FIGS. 17 to 22 are cross-sectional views illustrating a process of manufacturing a subpixel of an OLED display according to an example embodiment of the disclosure.

Figure 17:
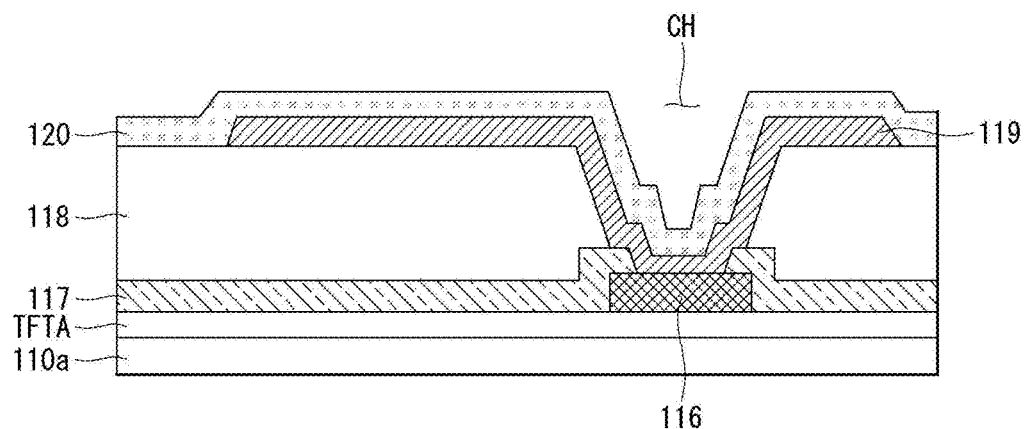
FIGS. 17 to 22 are cross-sectional views illustrating a process of manufacturing a subpixel of an OLED display according to an example embodiment of the disclosure.

As shown in FIG. 17, a transistor unit TFTA including a driving transistor, etc. is formed on a lower substrate 110a. A lower insulating layer 117 is formed on the transistor unit TFTA. A planarization layer 118 is formed on the lower insulating layer 117 and is etched so that a portion of an electrode layer 116 of the driving transistor is exposed, thereby forming a contact hole CH. A connection electrode layer 119 is formed on the planarization layer 118. In this instance, the connection electrode layer 119 is positioned on an upper surface of the planarization layer 118 and is patterned to be connected to the electrode layer 116 of the driving transistor positioned inside the contact hole CH. Hence, the connection electrode layer 119 is positioned corresponding to the contact hole CH and an emission region EMA. A sacrificial layer 120 is formed on the planarization layer 118. The sacrificial layer 120 covers the connection electrode layer 119 and is formed on the planarization layer 118.

Figure 18:
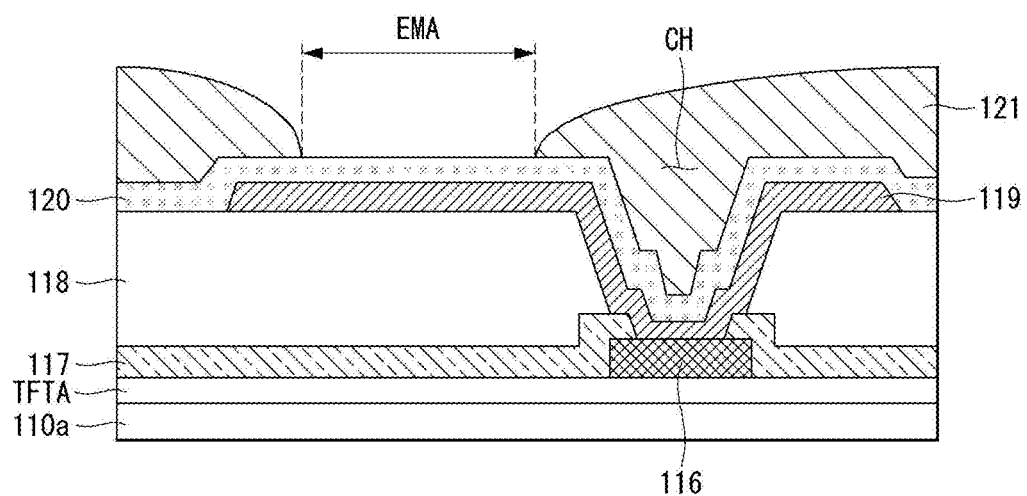
Figure 19:
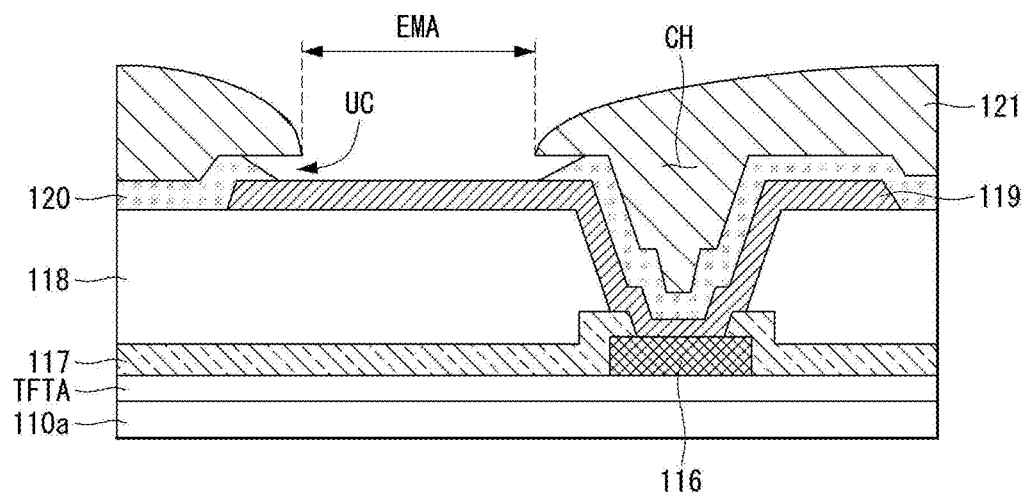

As shown in FIG. 18, a separation layer 121 is formed on the sacrificial layer 120, and an etching process is performed to expose an area to be defined as the emission region EMA. As shown in FIG. 19, an undercut portion UC is formed under the separation layer 121 by the etching process. For example, the sacrificial layer 120 is removed to provide the undercut portion UC under the separation layer 121. The sacrificial layer 120 is drawn to the inside of the separation layer 121 so that the connection electrode layer 119 is exposed more widely than the emission region EMA.

Figure 20:
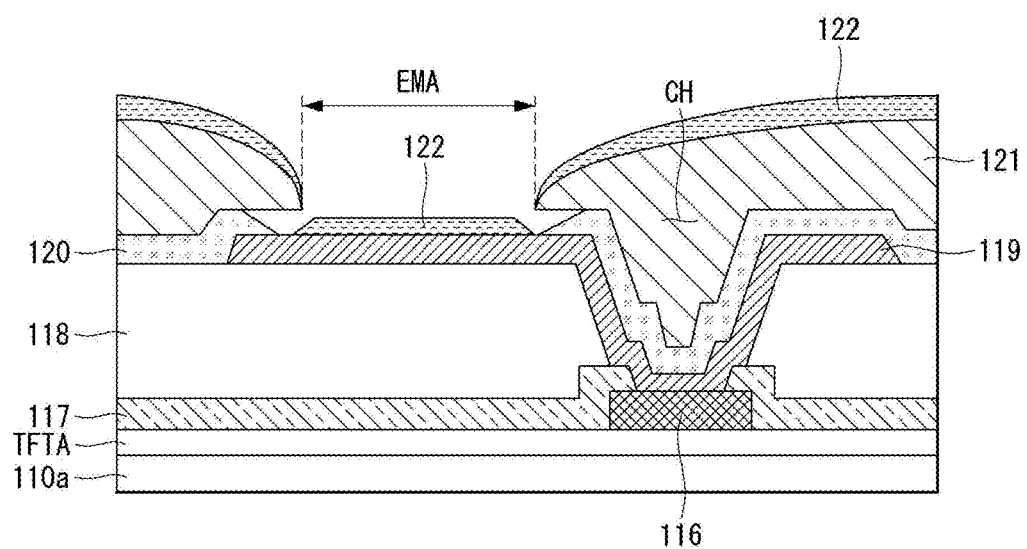

As shown in FIG. 20, a lower electrode layer 122 is formed on the separation layer 121. The lower electrode layer 122 is dividedly formed (pixelated) in subpixels by the separation layer 121. The lower electrode layer 122 occupies only an area corresponding to the emission region EMA and is formed on the connecting electrode layer 119.

Figure 21:
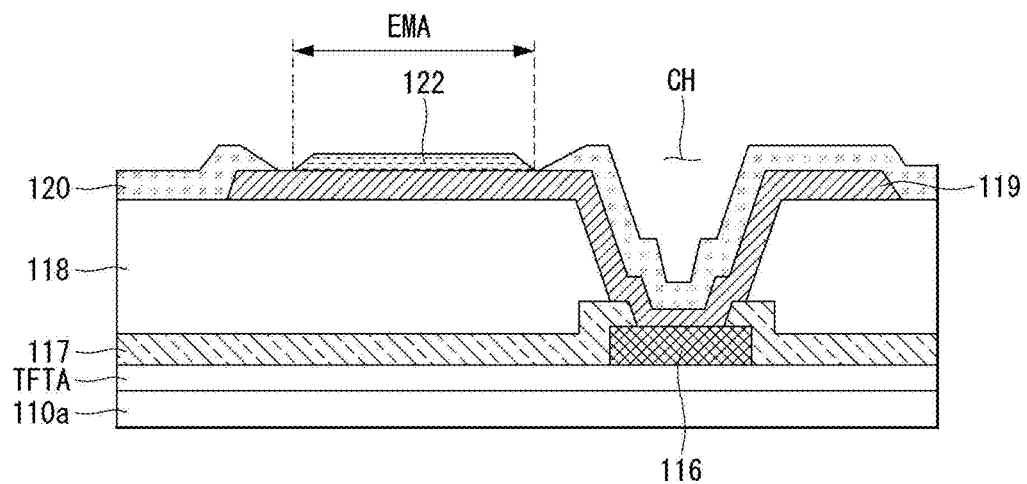

As shown in FIG. 21, the separation layer 121 is removed. The separation layer 121 may be removed through a lift-off process, but is not limited thereto. As the separation layer 121 is removed, the sacrificial layer 120 and the lower electrode layer 122 are exposed at an uppermost layer of the lower substrate 110a.

Figure 22:
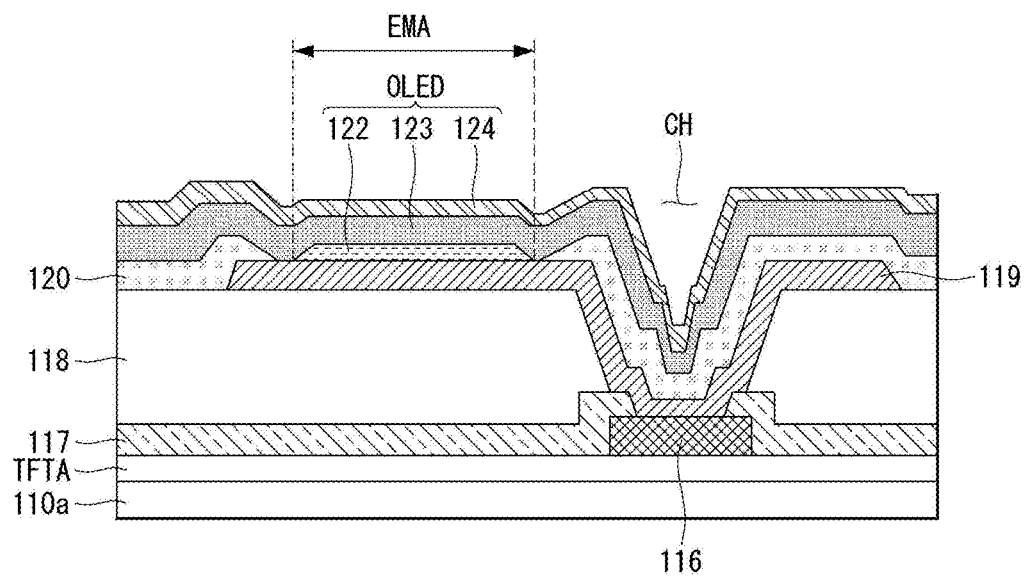

As shown in FIG. 22, an organic emission layer 123 is formed on the sacrificial layer 120 and the lower electrode layer 122. The organic emission layer 123 is formed to cover an entire display area of the lower substrate 110a. The organic emission layer 123 may include an emission layer and a functional layer (e.g., including a hole injection layer, a hole transport layer, an electron transport layer, an electron injection layer, etc.), or may include an emission layer, a functional layer, and a charge generation layer. An upper electrode layer 124 is formed on the organic emission layer 123. The upper electrode layer 124 is formed to entirely cover the organic emission layer 123.

As described above, the embodiments of the disclosure can improve the aperture ratio while reducing the current leakage of the light emitting diode based on the bankless structure, in which the self-alignment of the lower electrode layer is implemented, and the structure in which the contact hole is disposed in the outer area of the subpixel. Further, the embodiments of the disclosure can provide the structure having the high aperture ratio and the excellent electrical characteristics so that the ultra-high resolution is achieved.

It will be apparent to those skilled in the art that various modifications and variations can be made in the electroluminescent display and the method of manufacturing the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A method of manufacturing an electroluminescent display, comprising:
  forming a sacrificial layer on a lower substrate;
  forming a separation layer on the sacrificial layer such that a portion of the sacrificial layer is exposed;
  etching the sacrificial layer such that a portion of the sacrificial layer exposed by the separation layer is removed and such that a portion of the sacrificial layer covered by the separation layer is undercut to define a tapered edge of the sacrificial layer;
  depositing a conductive material over the separation layer and in the portion exposed by the separation layer to form a lower electrode at the portion exposed by the separation layer;
  removing the separation layer;
  forming an organic emission layer on the sacrificial layer and the lower electrode; and
  forming an upper electrode layer on the organic emission layer,
  wherein the removing the separation layer includes removing an entirety of the separation layer.

2. The method of claim 1, wherein the separation layer defines a plurality of exposed portions,
  wherein the etching the sacrificial layer removes respective portions of the sacrificial layer at the respective exposed portions to define respective emission regions,
  wherein the depositing the conductive material simultaneously forms a plurality of lower electrodes at the respective emission regions for a plurality of subpixel areas such that the lower electrodes are self-aligned with respect to the emission regions.

3. The method of claim 1, wherein, after the etching the sacrificial layer, a portion of the sacrificial layer covered by the separation layer remains, and the remaining portion of the sacrificial layer covered by the separation layer includes the tapered edge at a portion covered by the separation layer.

4. A method of manufacturing an electroluminescent display, comprising:
  forming a sacrificial layer on a lower substrate;
  forming a separation layer on the sacrificial layer such that a portion of the sacrificial layer is exposed;
  etching the sacrificial layer such that a portion of the sacrificial layer exposed by the separation layer is removed and such that a portion of the sacrificial layer covered by the separation layer is undercut to define a tapered edge of the sacrificial layer;
  depositing a conductive material over the separation layer and in the portion exposed by the separation layer to form a lower electrode at the portion exposed by the separation layer;
  removing the separation layer; and
  forming an organic emission layer on the sacrificial layer and the lower electrode,
  wherein the forming an organic emission layer on the sacrificial layer and the lower electrode includes forming the organic emission layer directly on the sacrificial layer at a portion from which the separation layer was removed.

5. The method of claim 4, wherein the separation layer defines a plurality of exposed portions, wherein the etching the sacrificial layer removes respective portions of the sacrificial layer at the respective exposed portions to define respective emission regions, wherein the depositing the conductive material simultaneously forms a plurality of lower electrodes at the respective emission regions for a plurality of subpixel areas such that the lower electrodes are self-aligned with respect to the emission regions.

6. The method of claim 4, wherein, after the etching the sacrificial layer, a portion of the sacrificial layer covered by the separation layer remains, and the remaining portion of the sacrificial layer covered by the separation layer includes the tapered edge at a portion covered by the separation layer.

\* \* \* \* \*